US008091614B2

(12) United States Patent
Martin et al.

(10) Patent No.: US 8,091,614 B2
(45) Date of Patent: Jan. 10, 2012

(54) AIR/FLUID COOLING SYSTEM

(75) Inventors: Yves C. Martin, Ossining, NY (US);
Theodore G. Van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 1214 days.

(21) Appl. No.: 11/558,842

(22) Filed: Nov. 10, 2006

(65) Prior Publication Data
US 2008/0110594 A1 May 15, 2008

(51) Int. Cl.
*F28F 7/00* (2006.01)
*H05K 7/20* (2006.01)

(52) U.S. Cl. .................... 165/80.4; 165/80.3
(58) Field of Classification Search ............ 165/80.4, 165/80.3, 104.33, 104.21, 137; 361/699, 361/700, 702, 704; 257/714, 715; 174/15.2, 174/16.3
See application file for complete search history.

(56) References Cited

U.S. PATENT DOCUMENTS

| 3,590,915 | A | 7/1971 | Riedel et al. |
| 3,752,132 | A | 8/1973 | Bentz et al. |
| 4,067,205 | A | 1/1978 | Mayhue |
| 4,179,894 | A | 12/1979 | Hughes |
| 4,300,623 | A | 11/1981 | Meckler |
| 4,573,067 | A | 2/1986 | Tuckerman et al. |
| 4,635,709 | A | 1/1987 | Altoz |
| 4,831,844 | A | 5/1989 | Kadle |
| 5,223,210 | A | 6/1993 | Hunsbedt et al. |
| 5,370,178 | A * | 12/1994 | Agonafer et al. ............ 165/137 |
| 5,482,113 | A * | 1/1996 | Agonafer et al. ............ 165/137 |
| 5,529,115 | A * | 6/1996 | Paterson .................. 165/104.33 |
| 5,647,430 | A * | 7/1997 | Tajima .................... 165/104.33 |
| 6,059,567 | A | 5/2000 | Bolton et al. |
| 6,163,073 | A * | 12/2000 | Patel ............................ 257/712 |
| 6,232,006 | B1 | 5/2001 | Breault |
| 6,279,519 | B1 | 8/2001 | Nagel et al. |
| 6,327,994 | B1 | 12/2001 | Labrador |
| 6,410,982 | B1 * | 6/2002 | Brownell et al. ............ 257/714 |
| 6,477,045 | B1 * | 11/2002 | Wang ............................ 361/700 |
| 6,591,898 | B1 * | 7/2003 | Chu et al. ..................... 165/80.4 |
| 6,760,221 | B2 * | 7/2004 | Goth et al. .................... 361/699 |
| 6,834,713 | B2 * | 12/2004 | Ghosh et al. ............ 165/104.33 |
| 6,969,907 | B2 | 11/2005 | Imai et al. |
| 6,989,592 | B2 | 1/2006 | Chang et al. |
| 7,369,410 | B2 * | 5/2008 | Chen et al. .................... 361/701 |
| 2004/0238162 | A1 * | 12/2004 | Seiler et al. ................... 165/148 |
| 2006/0162900 | A1 * | 7/2006 | Huang et al. ................ 165/80.4 |

FOREIGN PATENT DOCUMENTS

| CN | 2671302 Y | 1/2005 |
| JP | 2005236222 A2 | 2/2004 |

* cited by examiner

*Primary Examiner* — Tho V Duong

(57) ABSTRACT

The present invention is an air/fluid cooling system. In one embodiment an apparatus for dissipating heat from a heat-generating device includes a base having a first side configured for thermal coupling to the heat-generating device, an air-based cooling path coupled to the base, for dissipating at least a portion of the heat via air, and a fluid-based cooling path coupled to the base, for dissipating at least a portion of the heat via a fluid. The air-based cooling path and the fluid-based cooling path may be operated simultaneously or individually to dissipate heat from the heat generating device and to allow access to the cooling system, for example for maintenance, repairs and upgrades.

17 Claims, 7 Drawing Sheets

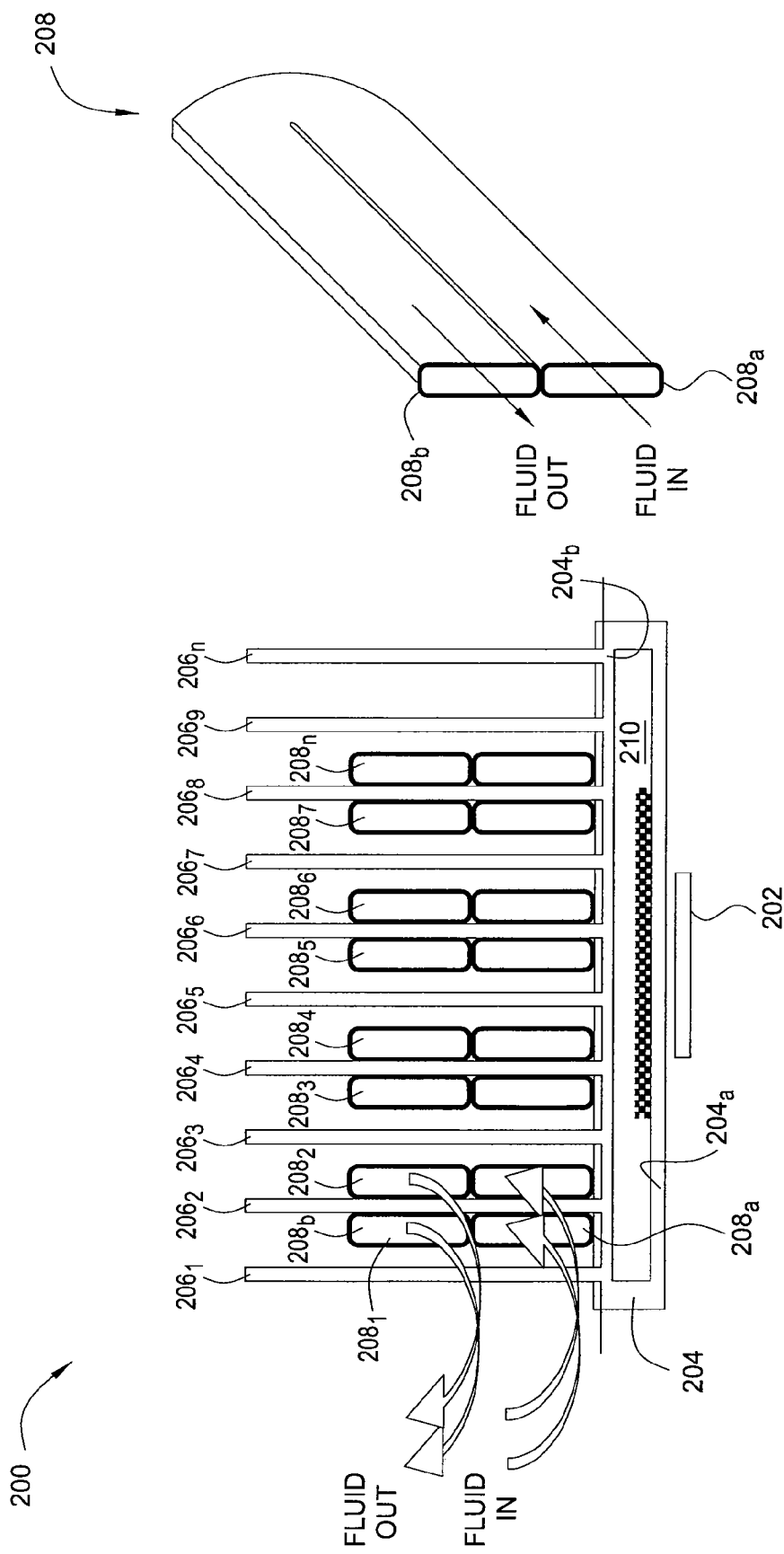

AIR/FLUID COOLING SYSTEM

FIELD OF THE INVENTION

The present invention relates generally to microprocessor and integrated circuits, and relates more particularly to the cooling of integrated circuit (IC) chips.

BACKGROUND OF THE INVENTION

Recent years have seen an evolution toward higher-power microprocessor chips. This evolution in turn has driven interest in high-performance cooling systems (e.g., heat sinks) to evacuate heat from the chips, because the more powerful chips tend to generate more heat in operation. If this heat is not adequately dissipated, the chips are likely to fail.

Two common systems for evacuating heat from microprocessor chips use either air or fluid as a transport means to remove heat from a chip. While both systems perform well, they are both also subject to several drawbacks. For instance, air-based cooling systems tend to be rather large and noisy, and chips having high power densities (e.g., in excess of 100 W/cm$^2$) are difficult to cool using an air-based system. Fluid cooling systems, while typically smaller, quieter and more efficient than air-based systems, are also more complex and more costly to implement and maintain. Moreover, the risk of leaks has impeded the general acceptance of fluid-based systems.

Air cooling is the default cooling method in most low end and midrange computer and server systems. Air cooling is typically favored by manufacturers because it operates in all environments and allows flexible installation and handling of servers without the complexity of plumbing. In data centers that employ many servers, however, the air cooling systems tend to experience especially large heat loads. Thus, in the data center environment, it is advantageous to have the option to additionally provide fluid cooling, which is not only a more efficient cooling method, but also costs less in terms of power and infrastructure.

Thus, there is a need for a cooling system that selectively allows heat to be dissipated from a heat generating device via air, fluid or both.

SUMMARY OF THE INVENTION

The present invention is an air/fluid cooling system. In one embodiment an apparatus for dissipating heat from a heat-generating device includes a base having a first side configured for thermal coupling to the heat-generating device, an air-based cooling path coupled to the base, for dissipating at least a portion of the heat via air, and a fluid-based cooling path coupled to the base, for dissipating at least a portion of the heat via a fluid. The air-based cooling path and the fluid-based cooling path may be operated simultaneously or individually to dissipate heat from the heat generating device and to allow access to the cooling system, for example for maintenance, repairs and upgrades.

BRIEF DESCRIPTION OF THE DRAWINGS

So that the manner in which the above recited embodiments of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a cross sectional view illustrating a second embodiment of an air/fluid cooling system, according to the present invention;

FIG. 3 is a perspective view illustrating one embodiment of a fluid channel for use in the cooling system of FIG. 2;

To facilitate understanding, identical reference numerals have been used, where possible, to designate identical elements that are common to the figures.

DETAILED DESCRIPTION

In one embodiment, the present invention is an air/fluid cooling system for use in dissipating heat from heat-generating devices (e.g., microprocessor chips). Embodiments of the present invention can be referred to as "water-assist" or "fluid assist" cooling. Embodiments of the present invention utilize both air and fluid to remove heat from a chip, thereby maximizing the cooling efficiency of the cooling system. Moreover, in the event that one of the air or the fluid component of the cooling system should fail, the second component serves as a backup, allowing the cooling system to continue operation.

Figure 1:
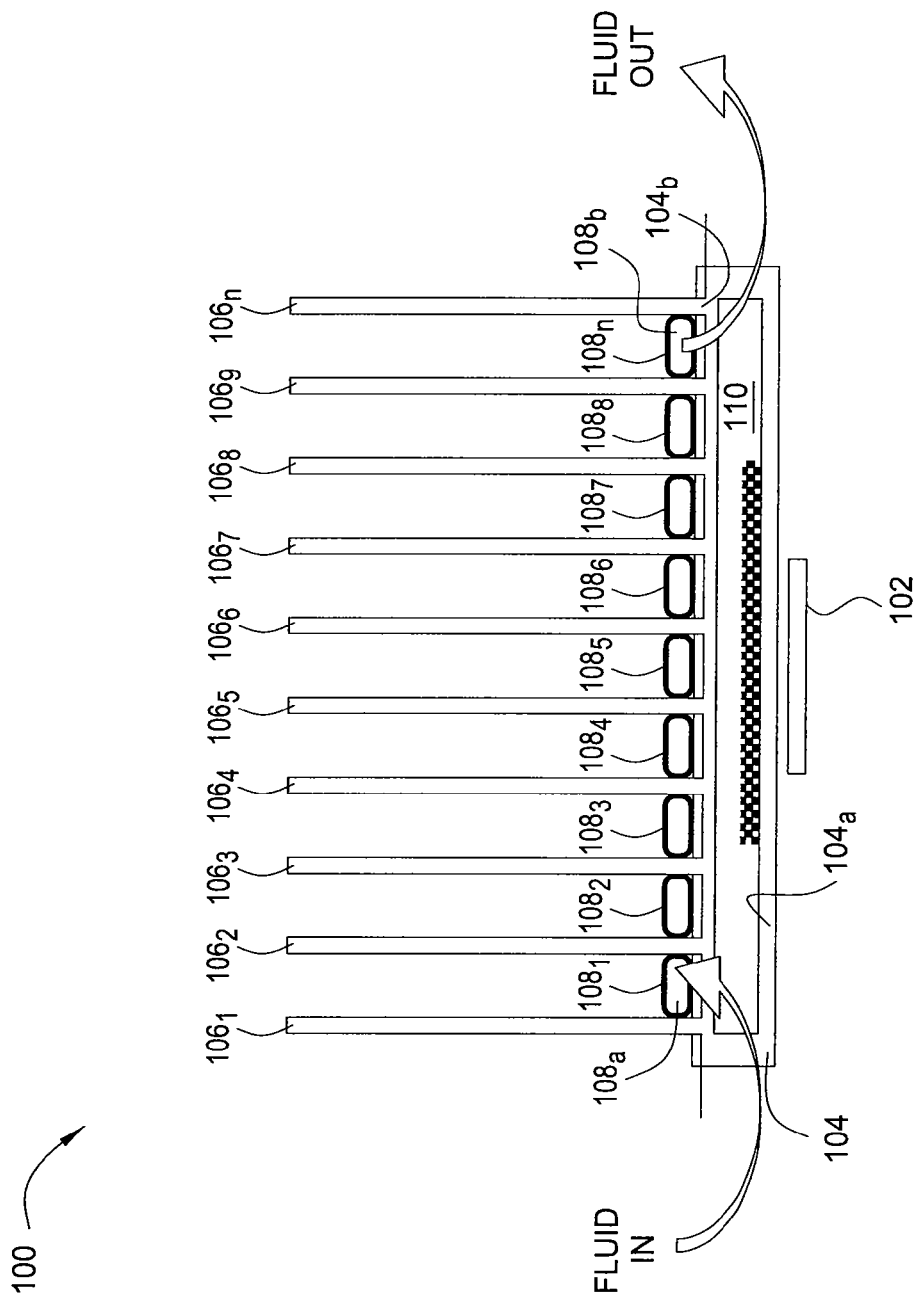
FIG. 1 is a cross sectional view illustrating one embodiment of an air/fluid cooling system, according to the present invention.

FIG. 1 is a cross sectional view illustrating one embodiment of an air/fluid cooling system 100, according to the present invention. As illustrated, the cooling system 100 may be deployed to dissipate heat from a microprocessor chip 102 or other heat-generating device.

The cooling system 100 comprises a base 104, a plurality of fins 106$_1$-106$_n$ (hereinafter collectively referred to as "fins 106") and at least one fluid channel 108$_1$-108$_n$ (hereinafter collectively referred to as "fluid channels 108").

The base 104 is configured for direct thermal contact with the chip 102 (e.g., via a thermal interface, not shown). To this end, the base 104 comprises at least a first relatively flat surface 104a that is adapted for contact with the chip 102. In one embodiment, the base 104 comprises a solid block of heat conducting material, such as copper, aluminum, diamond, silicon carbide, chrome, nickel, iron, or a combination of these materials. In another embodiment, the base includes a heat pipe (not shown) or a vapor chamber 110 comprised of a hollow interior section of the base 104 that is partly filled with water or other common two-phase materials.

In one embodiment, the fins 106 are coupled to a second relatively flat surface 104b of the base 104 (i.e., disposed opposite the first relatively flat surface 104a) and are positioned in a substantially perpendicular orientation relative to the base 104. In other embodiments, the fins 106 may be coupled to the first relatively flat surface 104a of the base 104, or to the sides of the base 104. The fins 106 are spaced apart relative to each other along the length of the base 104, such that a space is created between each pair of fins 106.

The fluid channels 108 are disposed adjacent to the base 104, and in one embodiment, a fluid channel 108 is disposed between two fins 106. In one embodiment, the fluid channels 108 are affixed to the base 104, e.g., via solder or a polymer bond. The fluid channels 108 are substantially tubular in shape and are adapted to circulate a fluid therethrough. To this end, each fluid channel 108 comprises an inlet 108a and an outlet 108b. Fluid is circulated through a fluid channel 108 from the inlet 108a to the outlet 108b such that heat transferred to the circulating fluid is carried out of the cooling system 100 as the fluid exits the fluid channel 108. In one embodiment, the fluid channels 108 are comprised of a metal. In one embodiment, the fluid circulated through the fluid channels 108 comprises a water-based coolant, high-pressure air, pressurized air, vapor, fluorocarbons, hydrocarbons, helium, hydrogen, oxygen, nitrogen, carbon dioxide or a refrigerant.

In operation, heat is transferred from the chip 102 to the base 104 via the thermal interface. The base 104 then spreads the heat to the fins 106 and to the fluid channels 108. Heat transferred to the fins 106 is then dissipated from the cooling system 100 via air (i.e., with the assistance of one or more fans, not shown), while heat transferred to the fluid channels 108 is dissipated via fluid disposed therein. In one embodiment, the air cooling path and the fluid cooling path are implemented simultaneously to dissipate heat from the chip 102. In another embodiment, only one of the air fluid path and the fluid cooling path is implemented at a given time. In this embodiment, the cooling system 100 may transition from the use of one cooling path to the other while the device being cooled is in operation (i.e., without interruption of operation).

The cooling system 100 thus provides high performance cooling of microprocessor chips and other heat-generating devices. By providing both air cooling and fluid cooling, dissipation of heat from the heat generating device can be accomplished more quickly and more efficiently than is possible using existing heat sink technology. Moreover, the provision of two cooling paths (i.e., one air, one fluid) allows the removal or isolation of one of the cooling paths while the other is in operation. This may be advantageous, for example, for maintenance and repair purposes, for hot swap of components, or for when one of the cooling paths fails. In addition, the use of metal for the fluid channels reduces the chances of fluid leaking into the chip 102. In particular, the chances of fluid leaking from the cooling system 100 at a location other than a connection (which in one embodiment is completely located outside of the cooling system 100) are greatly reduced, thus reducing the risk of chip failure due to leaks.

FIG. 2 is a cross sectional view illustrating a second embodiment of an air/fluid cooling system 200, according to the present invention. Like the cooling system 100, the cooling system 200 may be deployed to dissipate heat from a microprocessor chip 202 or other heat-generating device.

Also like the cooling system 100, the cooling system 200 comprises a base 204, a plurality of fins $206_1$-$206_n$ (hereinafter collectively referred to as "fins 206") and at least one fluid channel $208_1$-$208_n$ (hereinafter collectively referred to as "fluid channels 208").

The base 204 is configured for direct thermal contact with the chip 202 (e.g., via a thermal interface, not shown). To this end, the base 204 comprises at least a first relatively flat surface 204a that is adapted for contact with the chip 202. In one embodiment, the base 204 comprises a solid block of heat conducting material, such as copper, aluminum, diamond, silicon carbide, chrome, nickel, iron, or a combination of these materials. In another embodiment, the base includes a heat pipe (not shown) or a vapor chamber 210 comprised of a hollow interior section of the base 204 that is partly filled with water or other common 2-phase materials.

In one embodiment, the fins 206 are coupled to a second relatively flat surface 204b of the base 204 (i.e., disposed opposite the first relatively flat surface 204a) and are positioned in a substantially perpendicular orientation relative to the base 204. In other embodiments, the fins 206 may be coupled to the first relatively flat surface 204a of the base 204, or to the sides of the base 204. The fins 206 are spaced apart relative to each other along the length of the base 204, such that a space is created between each pair of fins 206.

The fluid channels 208 are disposed adjacent to the base 204, and in one embodiment, a fluid channel 208 is disposed between two fins 206. In one embodiment, each fluid channel 208 is substantially U-shaped and comprises an inlet 208a and an outlet 208b. For example, FIG. 3 is a perspective view illustrating one embodiment of a fluid channel 208 for use in the cooling system 200 of FIG. 2. Thus, in one embodiment, a fluid channel 208 is positioned such that one of the inlet 208a and the outlet 208b is positioned adjacent to the base 204, while both the inlet 208a and the outlet 208b lie substantially flush against a fin 206. This intimate coupling between the fins 206 and the fluid channels 208 provides for better heat coupling therebetween. In one embodiment, the fluid channels 208 are comprised of a metal. In one embodiment, the fluid circulated through the fluid channels 208 comprises a water-based coolant, pressurized air, high-pressure air, vapor, fluorocarbons, hydrocarbons, helium, hydrogen, oxygen, nitrogen, carbon dioxide or a refrigerant.

The shape and positioning of the fluid channels 208 allow the fluid channels 208 to be selectively inserted and removed. Thus, unlike the cooling system 100 illustrated in FIG. 1, the cooling system 200 is upgradeable and may be modified, post-deployment, to include more of less fluid channels 208.

Figure 4:
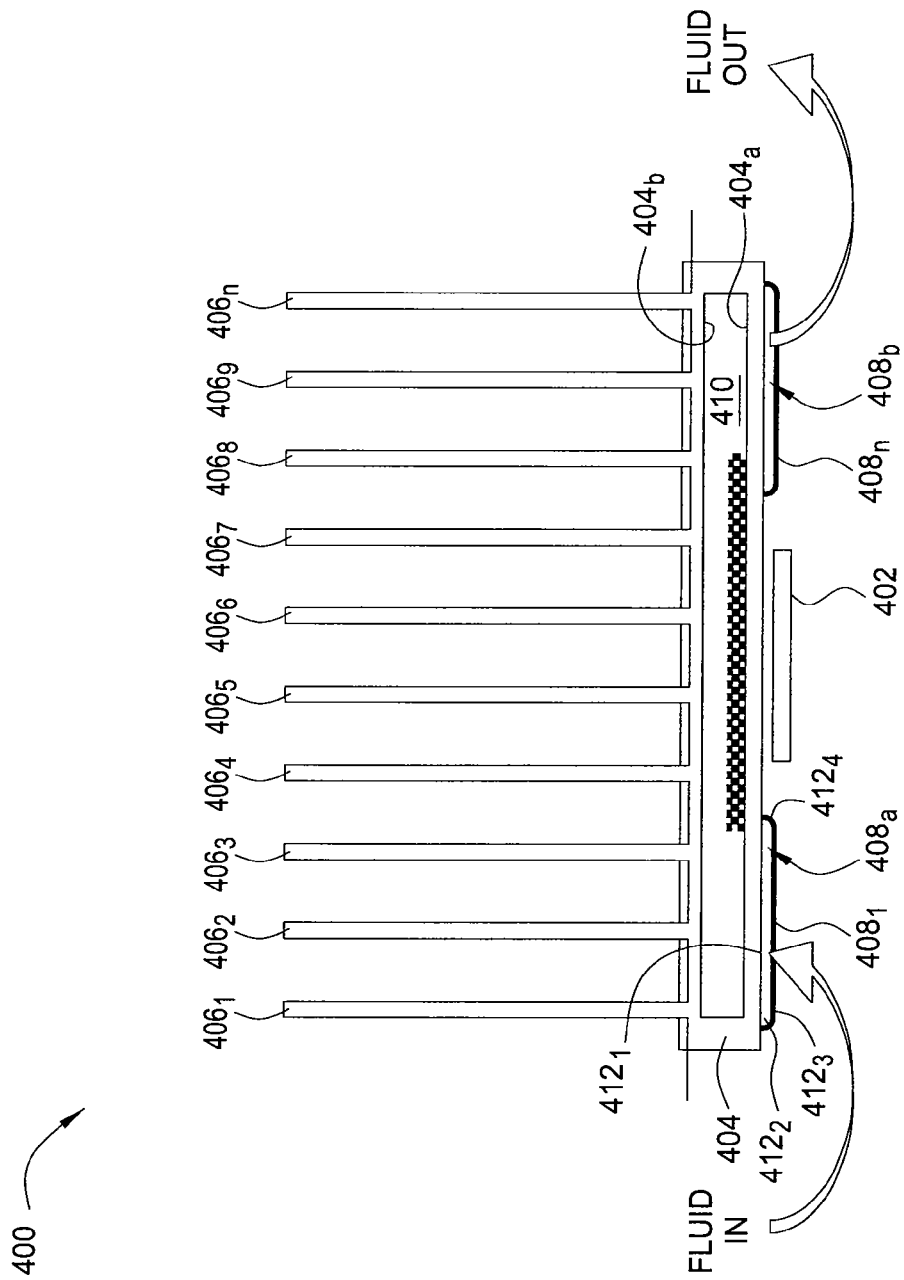
FIG. 4 is a cross sectional view illustrating a third embodiment of an air/fluid cooling system, according to the present invention.

FIG. 4 is a cross sectional view illustrating a third embodiment of an air/fluid cooling system 400, according to the present invention. Like the cooling systems 100 and 200, the cooling system 400 may be deployed to dissipate heat from a microprocessor chip 402 or other heat-generating device.

Also like the cooling systems 100 and 200, the cooling system 400 comprises a base 404, a plurality of fins $406_1$-$406_n$ (hereinafter collectively referred to as "fins 406") and at least one fluid channel $408_1$-$408_n$ (hereinafter collectively referred to as "fluid channels 408").

The base 404 is configured for direct thermal contact with the chip 402 (e.g., via a thermal interface, not shown). To this end, the base 404 comprises at least a first relatively flat surface 404a that is adapted for contact with the chip 402. In one embodiment, the base 404 comprises a solid block of heat conducting material, such as copper, aluminum, diamond, silicon carbide, chrome, nickel, iron, or a combination of these materials. In another embodiment, the base includes a heat pipe (not shown) or a vapor chamber 410 comprised of a hollow interior section of the base 404 that is partly filled with water or other common 2-phase materials.

In one embodiment, the fins 406 are coupled to a second relatively flat surface 404b of the base 404 (i.e., disposed opposite the first relatively flat surface 404a) and are positioned in a substantially perpendicular orientation relative to the base 404. In other embodiments, the fins 406 may be coupled to the first relatively flat surface 404a of the base 404, or to the sides of the base 404. The fins 406 are spaced apart relative to each other along the length of the base 404, such that a space is created between each pair of fins 406.

The fluid channels 408 are disposed adjacent to the base 404, and in one embodiment, the fluid channels 408 are coupled to the first relatively flat surface 404a of the base 404 (i.e., the same side of the base to which the chip 402 is coupled). In one embodiment, each fluid channel 408 is substantially tubular in shape and comprises an inlet 408a and an outlet 408b. In one embodiment, the fluid channels 408 are affixed to the base 404 using at least one of: a solder braze, a thermally conductive polymer, or another suitable bonding method. The method used to affix the fluid channels 408 to the base 404 provides both mechanical support and efficient thermal contact between the fluid channels 408 and the base 404.

In a further embodiment, the first relatively flat surface 404a of the base 404 comprises a first wall $412_1$ of a fluid channel 408, while at least one of a second $412_2$, third $412_3$ and fourth $412_4$ wall of the fluid channel 408 is comprised of a flexible material. This will allow the base 404 (which comprises a vapor chamber 410 in some embodiments) to be positioned in close proximity to the card that holds the processor and other components (not shown). That is, the second $412_2$, third $412_3$ and fourth $412_4$ walls of the fluid channel 408 can flex against protruding components on the card, while still allowing fluid to flow therein in very close contact to the base 404. In one embodiment, the fluid channels 408 are comprised of a metal. In one embodiment, the fluid circulated through the fluid channels 408 comprises a water-based coolant, pressurized air, high-pressure air, vapor, fluorocarbons, hydrocarbons, helium, hydrogen, oxygen, nitrogen, carbon dioxide or a refrigerant.

Figure 5:
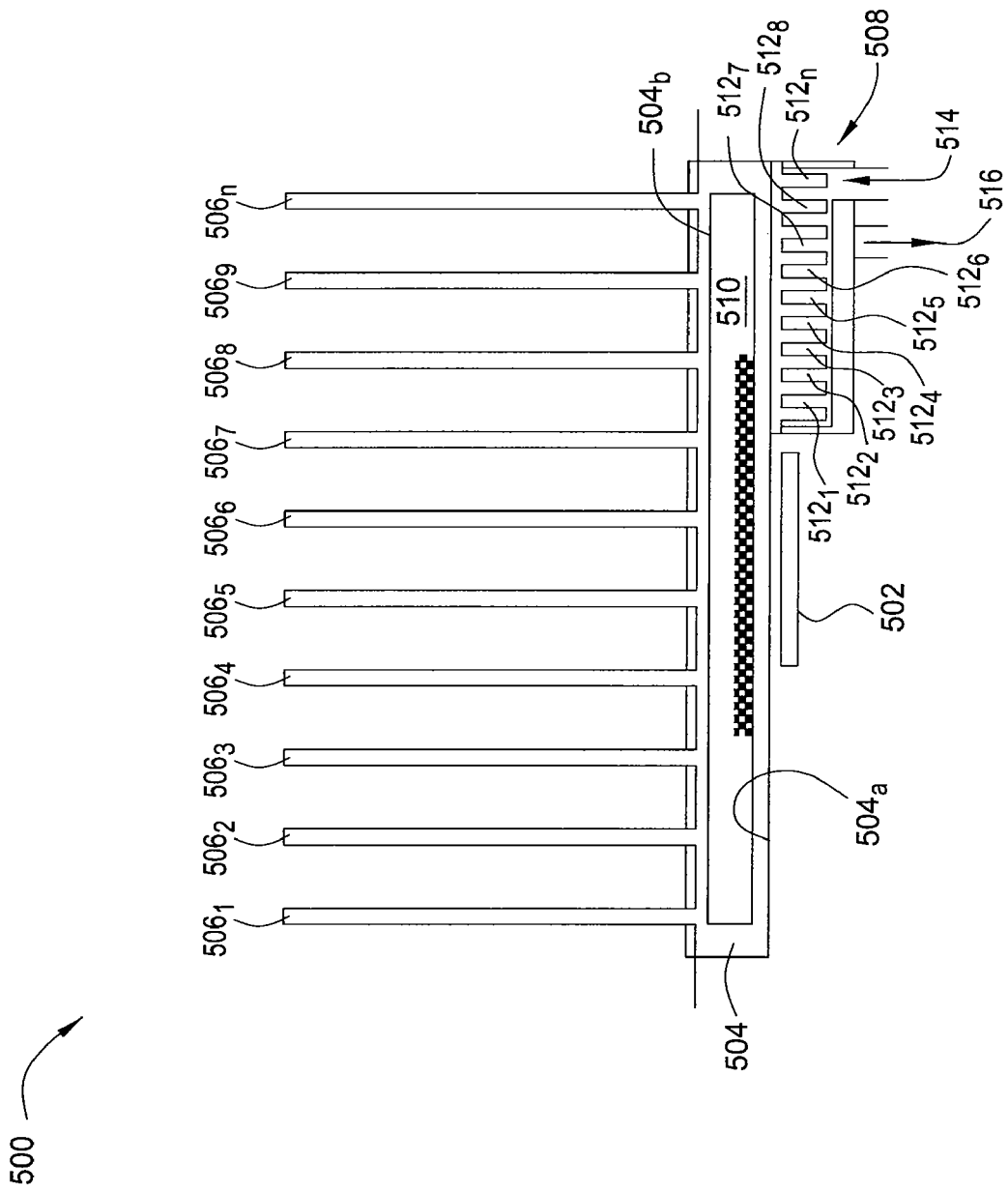
FIG. 5 is a cross sectional view illustrating a forth embodiment of an air/fluid cooling system, according to the present invention.

FIG. 5 is a cross sectional view illustrating a fourth embodiment of an air/fluid cooling system 500, according to the present invention. As illustrated, the cooling system 500 may be deployed to dissipate heat from a microprocessor chip 502 or other heat-generating device.

The cooling system 500 comprises a base 504, a plurality of fins $506_1$-$506_n$ (hereinafter collectively referred to as "fins 506") and at least one fluid cooler 508.

The base 504 is configured for direct thermal contact with the chip 502 (e.g., via a thermal interface, not shown). To this end, the base 504 comprises at least a first relatively flat surface 504a that is adapted for contact with the chip 502. In one embodiment, the base 504 comprises a solid block of heat conducting material, such as copper, aluminum, diamond, silicon carbide, chrome, nickel, iron, or a combination of these materials. In another embodiment, the base includes a heat pipe (not shown) or a vapor chamber 510 comprised of a hollow interior section of the base 504 that is partly filled with water or other common 2-phase materials.

In one embodiment, the fins 506 are coupled to a second relatively flat surface 504b of the base 504 (i.e., disposed opposite the first relatively flat surface 504a) and are positioned in a substantially perpendicular orientation relative to the base 504. In other embodiments, the fins 506 may be coupled to the first relatively flat surface 504a of the base 504, or to the sides of the base 504. The fins 506 are spaced apart relative to each other along the length of the base 504, such that a space is created between each pair of fins 506.

In one embodiment, the fluid cooler 508 is coupled to the first relatively flat surface 504a of the base 504, adjacent to the chip 502. In one embodiment, the fluid cooler 508 is a conventional fluid cooling system including its own fluid fins $512_1$-$512_n$ (hereinafter collectively referred to as "fins 512"), a fluid inlet 514 and a fluid outlet 516, thereby enhancing the performance of the cooling system 500. In one embodiment, the fluid circulated through the fluid channels 508 comprises a water-based coolant, high-pressure air, pressurized air, vapor, fluorocarbons, hydrocarbons, helium, hydrogen, oxygen, nitrogen, carbon dioxide or a refrigerant.

Figure 6:
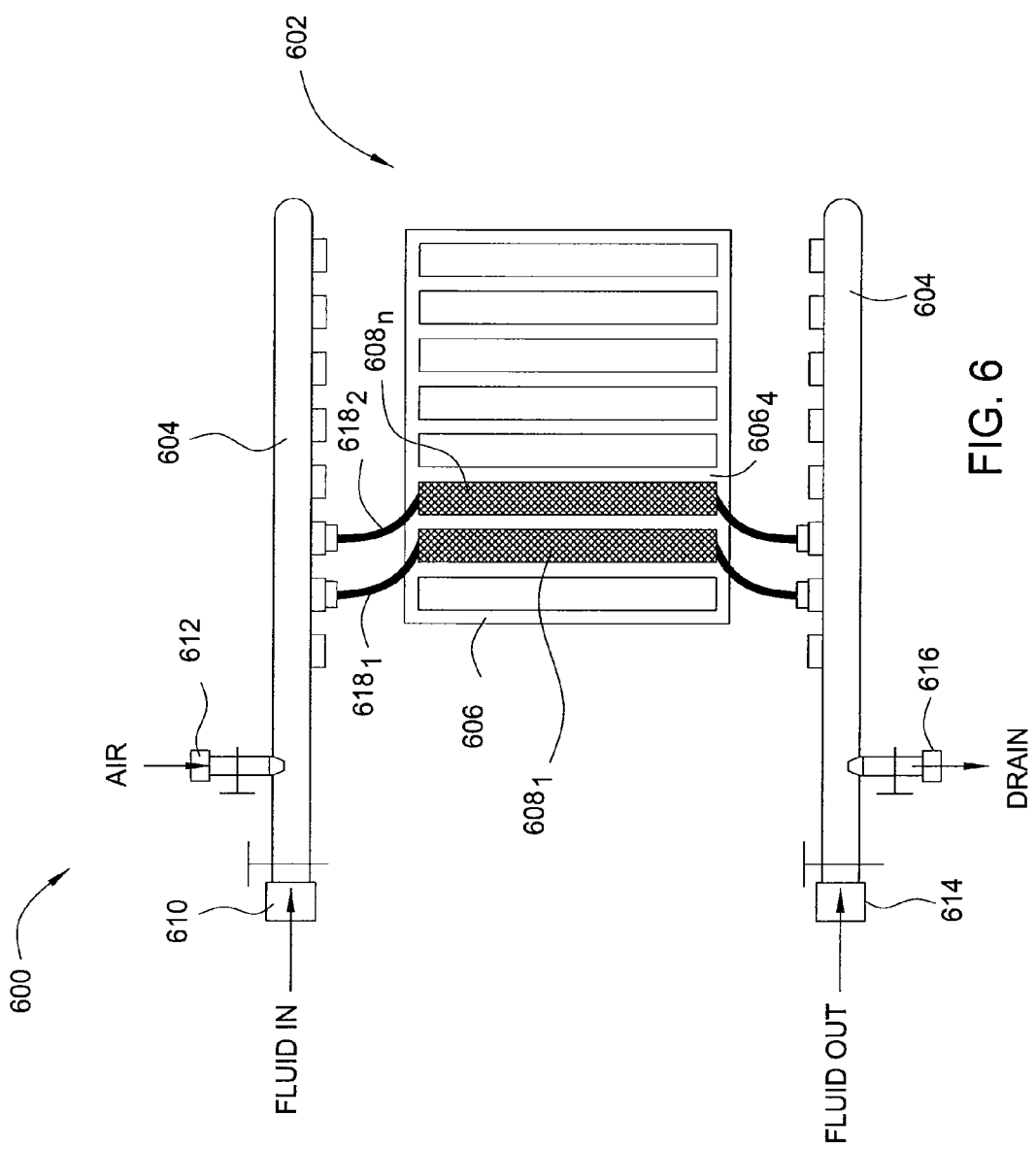
FIG. 6 is a schematic diagram illustrating one embodiment of a blade center-style cooling system that implements an air/fluid cooling system, according to the present invention.

FIG. 6 is a schematic diagram illustrating one embodiment of an air/fluid cooling system 600 that may be implemented, for example, to cool a blade center computing system.

The cooling system 600 comprises a blade center 602 and a fluid manifold 604 coupled to the blade center 602. The blade center 602 comprises a chassis 606 that includes a plurality of bays, each bay being sized to accommodate a blade server. In the example of FIG. 6, the blade center 602 has eight bays for a maximum of eight blade servers; two blade servers $608_1$ and $608_n$ (illustrated in cross-hatch, herein collectively referred to as "blade servers 608") have been inserted in the bays, and six bays are empty. Those skilled in the art will appreciate that the blade center 602 may be configured for use with any number of blade servers 608 and is not limited by the example illustrated.

Each blade server 608 acts as an independent computing unit, comprising its own processors, memory, storage, network controllers, operating system, applications and cooling system (not shown). In one embodiment, the cooling systems used to cool each of the blade servers 608 are air/fluid cooling systems. In one embodiment, the air/fluid cooling systems used to cool the blade servers 608 comprise any of the air/fluid cooling systems 100, 200, 400 or 500 discussed above with respect to the preceding Figures. As described above, the blade serves 608 are removable from the chassis 606, such that the blade serves 608 may be selectively added or removed from the blade center 602.

The manifold 604 comprises a fluid inlet 610, and air inlet 612, a fluid outlet 614, a drain 616 and a plurality of hoses $618_1$-$618_n$ (hereinafter collectively referred to as "hoses 618"). The hoses 618 couple the manifold 604 to the air/fluid cooling systems of the blade servers 608 to allow for circulation of fluid through the air/fluid cooling systems.

The cooling system 600 thereby allows fluid cooling capabilities to be implemented in a blade center computing system while the blade center computing system is running, by simply connecting the manifold 604 to the air/fluid cooling systems of the blade servers 608. Moreover, the air inlet 612 and drain 616 allow the fluid to be removed from the air/fluid cooling systems and hoses 618 (e.g., by air purging) for disconnection from the cooling system 600, also while the blade center computing system is running. In both cases (i.e., connection and disconnection of the fluid cooling capabilities), the blade center computing system continues to operate using air cooling in each individual blade server 608. This ability to add or remove auxiliary cooling capabilities while the blade center computing system is operating may prove especially advantageous in the case of mission critical systems, where a single unit in a multiple unit system must be accessed (e.g., for maintenance or repairs).

Moreover, the addition of the fluid cooling capabilities may allow the speed of the fans used to move air through the air/fluid cooling systems in the individual blade servers 608, which in turn will reduce the amount of noise generated by the cooling system 600 and the release of heat to ambient. This is especially advantageous in the case of very large cooling systems used to cool data centers or server farms, where the blade servers 608 may be as large as one foot high and one to two feet wide.

Figure 7:
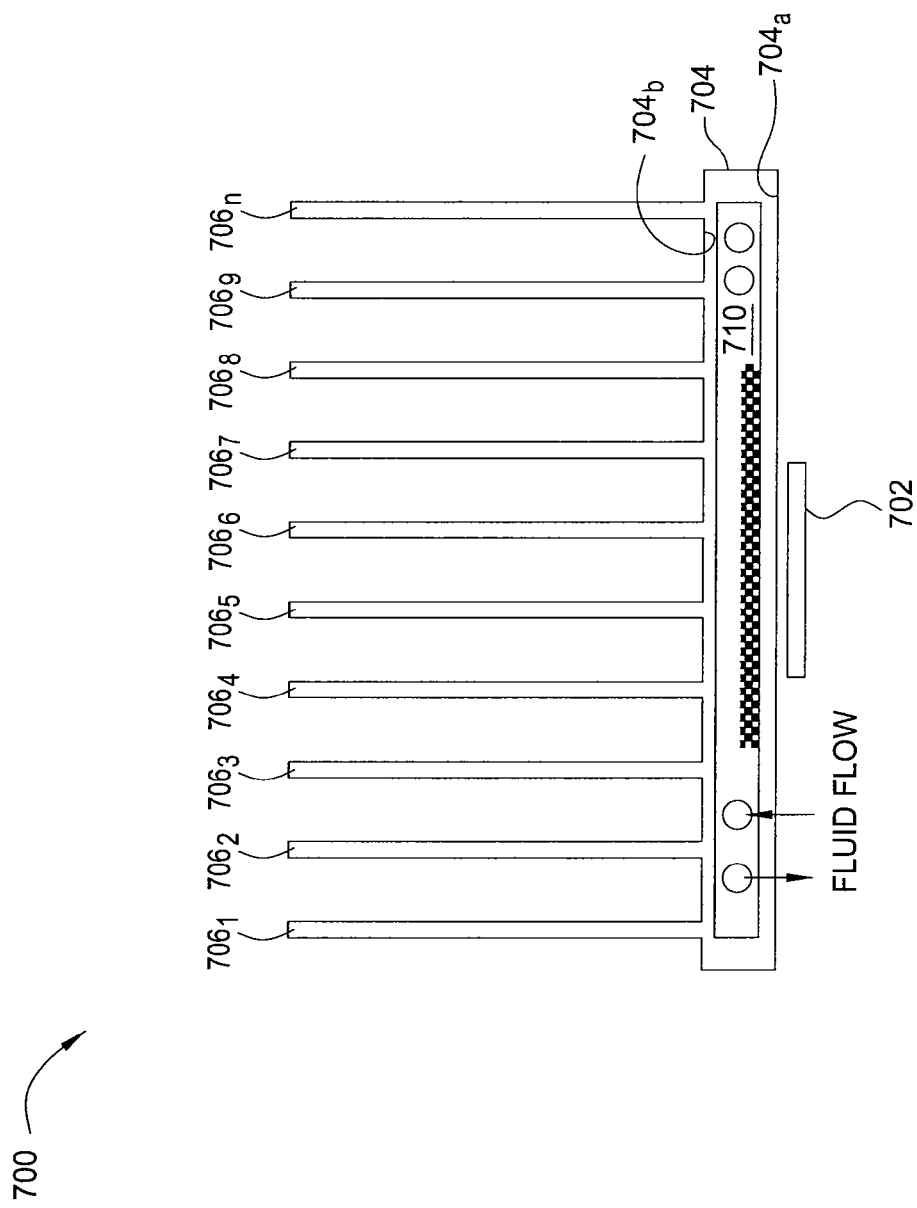
FIG. 7 is a schematic diagram illustrating a fifth embodiment of an air/fluid cooling system, according to the present invention.

FIG. 7 is a schematic diagram illustrating a fifth embodiment of an air/fluid cooling system 700, according to the present invention. As illustrated, the cooling system 700 may be deployed to dissipate heat from a microprocessor chip 702 or other heat-generating device.

The cooling system 700 comprises a base 704, a plurality of fins $706_1$-$706_n$ (hereinafter collectively referred to as "fins 706") and a plurality of fluid channels $708_1$-$708_n$ (hereinafter collectively referred to as "fluid channels 708").

The base 704 is configured for direct thermal contact with the chip 702 (e.g., via a thermal interface, not shown). To this end, the base 704 comprises at least a first relatively flat surface 704a that is adapted for contact with the chip 702. In this embodiment, the base 704 includes a vapor chamber 710 comprised of a hollow interior section of the base 504 that is partly filled with water or other common 2-phase materials.

In one embodiment, the fins 706 are coupled to a second relatively flat surface 704b of the base 704 (i.e., disposed opposite the first relatively flat surface 704a) and are positioned in a substantially perpendicular orientation relative to the base 704. In other embodiments, the fins 706 may be coupled to the first relatively flat surface 704a of the base 704, or to the sides of the base 704. The fins 706 are spaced apart relative to each other along the length of the base 704, such that a space is created between each pair of fins 706.

In one embodiment, the fluid channels 708 are embedded or disposed through the vapor chamber 710. In one embodiment, the fluid circulated through the fluid channels 708 comprises a water-based coolant, high-pressure air, pressurized air, vapor, fluorocarbons, hydrocarbons, helium, hydrogen, oxygen, nitrogen, carbon dioxide or a refrigerant.

Figure 8:
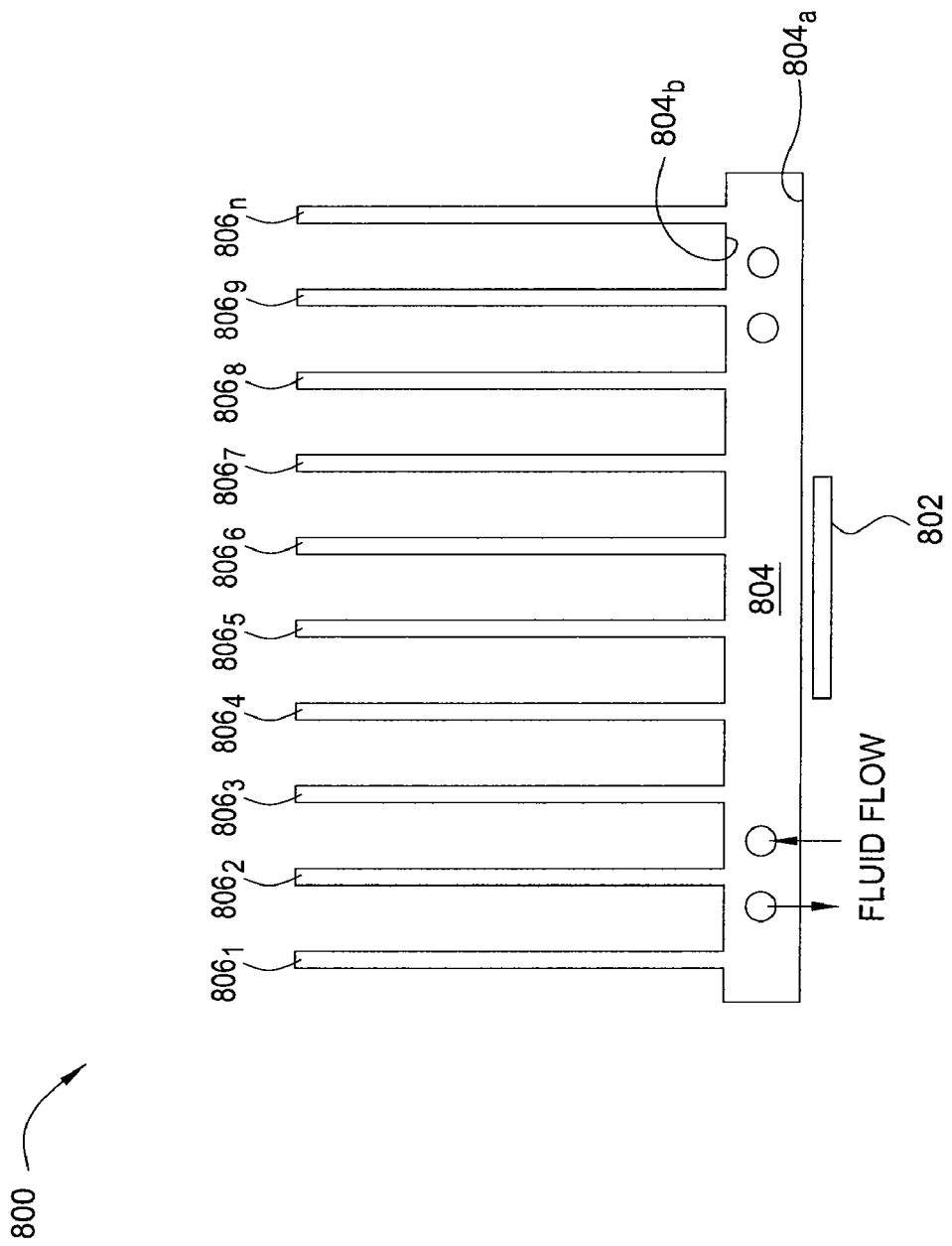
FIG. 8 is a schematic diagram illustrating a sixth embodiment of an air/fluid cooling system, according to the present invention.

FIG. 8 is a schematic diagram illustrating a sixth embodiment of an air/fluid cooling system 800, according to the present invention. As illustrated, the cooling system 800 may be deployed to dissipate heat from a microprocessor chip 802 or other heat-generating device.

The cooling system 800 comprises a base 804, a plurality of fins $806_1$-$806_n$ (hereinafter collectively referred to as "fins 806") and a plurality of fluid channels $808_1$-$808_n$ (hereinafter collectively referred to as "fluid channels 808").

The base 804 is configured for direct thermal contact with the chip 802 (e.g., via a thermal interface, not shown). To this end, the base 804 comprises at least a first relatively flat surface 804a that is adapted for contact with the chip 802. In this embodiment, unlike the embodiment illustrated in FIG. 7, the base 804 comprises a solid block of heat conducting material, such as copper, aluminum, diamond, silicon carbide, chrome, nickel, iron, or a combination of these materials.

In one embodiment, the fins 806 are coupled to a second relatively flat surface 804b of the base 804 (i.e., disposed opposite the first relatively flat surface 804a) and are positioned in a substantially perpendicular orientation relative to the base 804. In other embodiments, the fins 806 may be coupled to the first relatively flat surface 804a of the base 804, or to the sides of the base 804. The fins 806 are spaced apart relative to each other along the length of the base 804, such that a space is created between each pair of fins 806.

In one embodiment, the fluid channels 808 are embedded or disposed through the solid block of the base 804. In one embodiment, the fluid circulated through the fluid channels 808 comprises a water-based coolant, high-pressure air, pressurized air, vapor, fluorocarbons, hydrocarbons, helium, hydrogen, oxygen, nitrogen, carbon dioxide or a refrigerant.

It is understood that in all embodiments the fluid channels are in thermal contact with a chip-to-air heat exchanger in order to allow the removal of heat when the fluid circulates through the fluid channels.

Although the present invention has primarily been described within the context of the computer industry (e.g., for cooling high-performance information processors), those skilled in the art will appreciate that a dual air/fluid cooling system such as that described herein may be applied to advantage in a variety of other fields, including aerospace and aircraft cooling systems, maintenance panels and the like.

Thus, cooling system is disclosed that provides for more efficient dissipation of heat from heat-generating devices such as IC chips. Embodiments of the present invention utilize both air and fluid to remove heat from a chip, thereby maximizing the cooling efficiency of the cooling system. Moreover, in the event that one of the air or the fluid components of the cooling system should fail, the second component serves as a backup, allowing the cooling system to continue operation.

While foregoing is directed to the preferred embodiment of the present invention, other and further embodiments of the invention may be devised without departing from the basic scope thereof, and the scope thereof is determined by the claims that follow.

The invention claimed is:

1. An apparatus for dissipating heat from a heat-generating device, comprising:
    a base having a first side configured for thermal coupling to the heat-generating device;
    an air-based cooling path coupled to the base, for dissipating at least a portion of the heat via air, the air-based cooling path comprising a plurality of fins coupled to the base, each of the plurality of fins extending away from the base in a substantially perpendicular orientation relative to the base; and
    a fluid-based cooling path coupled to the base, for dissipating at least a portion of the heat via a fluid, the fluid-based cooling path comprising at least one fluid channel positioned between exactly two of said plurality of fins, the at least one fluid channel being adapted for circulating a fluid therethrough from an inlet to an outlet, wherein the at least one fluid channel is substantially U-shaped, and wherein the fluid-based cooling path is selectively removable from the apparatus in such a way that the air-based cooling path remains operational when the fluid-based cooling path is removed.

2. The apparatus of claim 1, wherein the fluid-based cooling path is coupled to a manifold.

3. The apparatus of claim 1, wherein the heat-generating device is an integrated circuit chip.

4. A method of cooling a heat-generating device, comprising:
    providing a base having a first side configured for thermal coupling to the heat-generating device;
    providing an air-based cooling path coupled to the base, for dissipating at least a portion of the heat via air, the air-based cooling path comprising a plurality of fins coupled to the base, each of the plurality of fins extending away from the base in a substantially perpendicular orientation relative to the base; and
    providing a fluid-based cooling path coupled to the base, for dissipating at least a portion of the heat via a fluid, the fluid-based cooling path comprising at least one fluid channel positioned between exactly two of said plurality of fins, the at least one fluid channel being adapted for circulating a fluid therethrough from an inlet to an outlet, wherein the fluid-based cooling path is selectively removable in such a way that the air-based cooling path remains operational when the fluid-based cooling path is removed.

5. The method of claim 4, further comprising:
    implementing at least one of the air-based cooling path and the fluid-based cooling path at a given time to dissipate heat from the heat-generating device.

6. The method of claim 4, further comprising:
cooling the heat-generating device using the air-based cooling path; and
isolating the fluid-based cooling path while the air-based cooling path is operating.

7. The method of claim 4, further comprising:
cooling the heat-generating device using the fluid-based cooling path; and
accessing the air-based cooling path while the fluid-based cooling path is operating.

8. The apparatus of claim 1, wherein the at least one fluid channel is positioned such that the inlet and the outlet lie substantially flush against a same one of the plurality of fins.

9. The apparatus of claim 8, wherein only one of the inlet and the outlet contacts the base.

10. The method of claim 4, further comprising:
switching between the air-based cooling path and the fluid-based cooling path such that, at a given time, the heat is dissipated only via the air or only via the fluid.

11. The apparatus of claim 1, wherein the base comprises a solid block comprised of at least one of: copper, aluminum, diamond, silicon carbide, chrome, nickel or iron.

12. The apparatus of claim 1, wherein the base comprises a vapor chamber.

13. The apparatus of claim 1, wherein the base comprises a heat pipe.

14. The apparatus of claim 1, wherein the fluid is at least one of: a water-based coolant, high-pressure air, pressurized air, a vapor, a fluorocarbon, a hydrocarbon, helium, hydrogen, oxygen, nitrogen, carbon dioxide or a refrigerant.

15. The apparatus of claim 1, wherein the at least one fluid channel is comprised of a metal.

16. The apparatus of claim 1, wherein the at least one fluid channel is substantially tubular in shape.

17. The apparatus of claim 16, wherein the at least one fluid channel is affixed to the base.

* * * * *